US009343295B2

(12) United States Patent
Sawada et al.

(10) Patent No.: US 9,343,295 B2
(45) Date of Patent: May 17, 2016

(54) VAPORIZING UNIT, FILM FORMING APPARATUS, FILM FORMING METHOD, COMPUTER PROGRAM AND STORAGE MEDIUM

(71) Applicant: Tokyo Electron Limited, Minato-ku (JP)

(72) Inventors: Ikuo Sawada, Nirasaki (JP); Sumie Nagaseki, Nirasaki (JP); Kyoko Ikeda, Nirasaki (JP); Tatsuro Ohshita, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 87 days.

(21) Appl. No.: 14/281,242

(22) Filed: May 19, 2014

(65) Prior Publication Data

US 2014/0256157 A1     Sep. 11, 2014

Related U.S. Application Data

(62) Division of application No. 12/678,765, filed as application No. PCT/JP2008/064420 on Aug. 11, 2008, now abandoned.

(30) Foreign Application Priority Data

Sep. 18, 2007  (JP) .................. 2007-241364

(51) Int. Cl.
*H01H 21/02* (2006.01)
*H01L 21/02* (2006.01)
*C23C 16/448* (2006.01)
*H01L 21/316* (2006.01)
*H01L 21/318* (2006.01)

(52) U.S. Cl.
CPC ...... *H01L 21/02271* (2013.01); *C23C 16/4486* (2013.01); *H01L 21/02181* (2013.01); *H01L 21/3185* (2013.01); *H01L 21/31612* (2013.01); *H01L 21/31645* (2013.01)

(58) Field of Classification Search
None
See application file for complete search history.

(56) References Cited

U.S. PATENT DOCUMENTS

| 4,020,979 A | 5/1977 | Shay et al. |
| 4,647,212 A | 3/1987 | Hankison |

(Continued)

FOREIGN PATENT DOCUMENTS

| JP | 2002 143885 | 5/2002 |
| JP | 2004-121962 | 10/2002 |

(Continued)

*Primary Examiner* — Joseph Miller, Jr.
(74) *Attorney, Agent, or Firm* — Oblon, McClelland, Maier & Neustadt, L.L.P.

(57) ABSTRACT

A vaporizing unit, in supplying a gas material produced by vaporizing a liquid material onto a substrate to conduct a film forming process, can vaporize the liquid material with high efficiency to suppress generation of particles. With the vaporizing unit, positively or negatively charged bubbles, which have a diameter of 1000 nm or less, are produced in the liquid material, and the liquid material is atomized to form a mist of the liquid material. Further, the mist of the liquid material is heated and vaporized. The fine bubbles are uniformly dispersed in advance in the liquid material, so that very fine and uniform mist particles of the liquid material are produced when the liquid material is atomized, which makes heat exchange readily conducted. By vaporizing the mist of the liquid material, vaporization efficiency is enhanced, and generation of particles can be suppressed.

6 Claims, 5 Drawing Sheets

(56) References Cited

U.S. PATENT DOCUMENTS

| | | | |
|---|---|---|---|
| 5,476,547 A * | 12/1995 | Mikoshiba | C23C 16/20 118/726 |
| 6,157,774 A | 12/2000 | Komino et al. | |
| 6,402,126 B2 | 6/2002 | Vaartstra et al. | |
| 6,931,203 B2 | 8/2005 | Toda et al. | |
| 7,673,856 B2 | 3/2010 | Toda et al. | |
| 2002/0062789 A1 * | 5/2002 | Nguyen | C23C 16/0281 118/715 |
| 2003/0146301 A1 | 8/2003 | Sun et al. | |
| 2004/0113289 A1 | 6/2004 | Toda et al. | |
| 2006/0054191 A1 | 3/2006 | Higuchi et al. | |
| 2006/0054205 A1 | 3/2006 | Yabe et al. | |
| 2006/0065254 A1 | 3/2006 | Okabe et al. | |
| 2007/0113829 A1 | 5/2007 | Allen | |
| 2007/0189972 A1 | 8/2007 | Chiba et al. | |
| 2008/0193645 A1 * | 8/2008 | Toda | B01B 1/005 427/255.23 |
| 2008/0197516 A1 | 8/2008 | Abe et al. | |
| 2009/0179093 A1 * | 7/2009 | Wada | B03C 3/12 239/707 |
| 2010/0003807 A1 * | 1/2010 | Nagaseki | C23C 18/08 438/466 |

FOREIGN PATENT DOCUMENTS

| | | |
|---|---|---|
| JP | 2004 265938 | 9/2004 |
| JP | 2006 100737 | 4/2006 |
| JP | 2006 147617 | 6/2006 |

\* cited by examiner

US 9,343,295 B2

VAPORIZING UNIT, FILM FORMING APPARATUS, FILM FORMING METHOD, COMPUTER PROGRAM AND STORAGE MEDIUM

CROSS-REFERENCE TO RELATED APPLICATIONS

This is a divisional application of U.S. application Ser. No. 12/678,765, filed on May 20, 2010, the entire contents of which is incorporated herein by reference. U.S. application Ser. No. 12/678,765 is a National Stage of PCT/JP08/064420, filed Aug. 11, 2008, and claims the benefit of priority under 35 U.S.C. §119 of Japanese Patent Application No. 2007-241364, filed on Sep. 18, 2007.

FIELD OF THE INVENTION

The present invention relates to a technique for supplying a gas material produced by vaporizing a liquid material to a target object to perform a film forming process thereon; and more particularly, to a technique for vaporizing a liquid material.

BACKGROUND OF THE INVENTION

As one of semiconductor manufacturing processes, there is a film forming process for forming a specific film on a surface of a semiconductor wafer (hereinafter, referred to as a "wafer") W. In the film forming process, a material gas produced by vaporizing a liquid material is introduced as a film forming gas into an apparatus.

As examples of the film forming process using the material gas produced by vaporizing the liquid material, there are a case in which a $SiO_2$ film is formed by using a processing gas obtained by vaporizing tetra ethyl oxysilane (TEOS) and oxygen ($O_2$) gas, and a case in which a silicon nitride ($Si_3N_4$) film is formed by using a processing gas obtained by vaporizing $Si_2Cl_6$ and ammonia ($NH_3$) gas.

A conventional example of a vaporizer for vaporizing the liquid material is illustrated in FIG. 5. The vaporizer of FIG. 5 includes a vertical cylindrical body 100 that is configured as a vaporization chamber and has a nozzle 101 installed at an upper portion thereof. At a leading end portion of the nozzle 101, a liquid material and a carrier gas are mixed to be discharged in a mist state into the cylindrical body 100 as in a sprayer. By heating the inside of the cylindrical body 100, the mist is vaporized to produce a gas material.

Meanwhile, recently, a liquid material having a low vapor pressure may be used due to the development of various devices. For example, a compound of hafnium (Hf) is employed as a film forming material.

For instance, Tetrakis(N-Ethyl-N-Methylamino)Hafnium (TEMAH) has a vapor pressure of about 0.11 kPa (0.85 Torr) at a temperature of about 85° C., and Hafnium Tetra-t-Butoxide (HTB) has a vapor pressure of about 0.55 kPa (4.12 Torr) at a temperature of about 85° C. These hafnium-based materials have a rather low vapor pressure, while TEOS has a vapor pressure of about 5.6 kPa (42 Torr) at a temperature of about 85° C.

The material having a low vapor pressure is difficult to be vaporized. For example, when the mist is adhered to an inner wall of the cylindrical body 100, the mist is dried and solidified at the inner wall and, then, detached from the inner wall to generate particles.

Meanwhile, when a heating temperature is raised to quickly vaporize the mist, it is difficult to uniformly heat the inside of the cylindrical body 100, and the mist may be decomposed and transformed by heating. Further, this phenomenon is more problematic when it is intended to increase a supply flow rate of the liquid material. As described above, it is very difficult to vaporize a low vapor pressure material, which is a problem to be solved in a film forming process using a new material.

In this connection, Patent Document 1 discloses a technique for improving vaporization efficiency by supplying a gas-liquid mixed fluid to a vaporizer and developing a structure of a nozzle to obtain a large amount of the gas material. However, a technique for increasing a flow rate of the gas material is still required.

Patent Document 1: Japanese Patent Laid-open Publication No. 2006-100737 (paragraphs [0023] to [0026])

SUMMARY OF THE INVENTION

The present invention has been devised in order to solve the problems described above. It is an object of the present invention to provide a vaporizing unit capable of vaporizing a liquid material with high efficiency when a film forming process is performed on a target object by supplying a gas material produced by vaporizing the liquid material to the target object, a film forming apparatus, a film forming method, a program for performing the film forming method and a storage medium storing the program.

In accordance with an aspect of the present invention, there is provided a vaporizing unit including: a bubble generation device for generating bubbles having a diameter of 1000 nm or less and charged positively or negatively in a liquid material for film formation by supplying a carrier gas for bubble generation into the liquid material; a vaporizer, connected to the bubble generation device, for vaporizing the liquid material to obtain a gas material; and a gas material outlet port, provided at the vaporizer, for discharging the gas material obtained by vaporization of the liquid material in the vaporizer, wherein the vaporizer includes a vaporization chamber for vaporizing the liquid material, an atomization part, provided at an inlet of the vaporization chamber, for atomizing the liquid material containing the bubbles supplied from the bubble generation device to produce a mist of the liquid material and supply the mist into the vaporization chamber, and a heater provided in the vaporization chamber to heat and vaporize the mist of the liquid material supplied from the atomization part into the vaporization chamber.

The bubble generation device may generate the bubbles by forming a revolving flow of the carrier gas.

The atomization part may be configured as a nozzle for discharging the liquid material containing the bubbles together with a carrier gas for atomization.

In accordance with another aspect of the present invention, there is provided a film forming apparatus including: a vaporizing unit for generating a gas material; and a film forming unit including a processing chamber connected to the vaporizing unit, a target object being loaded in the processing chamber and the film forming unit performing a film forming process on the target object by using the gas material supplied from the vaporizing unit, wherein the vaporizing unit includes: a bubble generation device for generating bubbles having a diameter of 1000 nm or less and charged positively or negatively in a liquid material for film formation by supplying a carrier gas for bubble generation into the liquid material; a vaporizer, connected to the bubble generation device, for vaporizing the liquid material to obtain the gas material; and a gas material outlet port, provided at the vaporizer, for discharging the gas material obtained by vaporization of the liquid material in the vaporizer, wherein the vaporizer includes a vaporization chamber for vaporizing the liquid material, an atomization part, provided at an inlet of the vaporization chamber, for atomizing the liquid material containing the bubbles supplied from the bubble generation device to produce a mist of the liquid material and supply the mist into the vaporization chamber, and a heater provided in the vaporization chamber to heat and vaporize the mist of the liquid material supplied from the atomization part into the vaporization chamber.

In accordance with still another aspect of the present invention, there is provided a film forming method including: generating bubbles having a diameter of 1000 nm or less and charged positively or negatively in a liquid material for film formation by supplying a carrier gas for bubble generation into the liquid material; producing a mist of the liquid material by atomizing the liquid material containing the bubbles; obtaining a gas material by heating and vaporizing the mist of the liquid material; and performing a film forming process on a target object in a processing chamber by supplying the gas material to the target object.

The generating bubbles may include forming a revolving flow of the carrier gas.

The producing a mist of the liquid material may include atomizing the liquid material containing the bubbles and a carrier gas for atomization through a nozzle.

In accordance with still another aspect of the present invention, there is provided a computer program for executing a film forming method on a computer, wherein the film forming method includes: generating bubbles having a diameter of 1000 nm or less and charged positively or negatively in a liquid material for film formation by supplying a carrier gas for bubble generation into the liquid material; producing a mist of the liquid material by atomizing the liquid material containing the bubbles; obtaining a gas material by heating and vaporizing the mist of the liquid material; and performing a film forming process on a target object in a processing chamber by supplying the gas material to the target object.

In accordance with still another aspect of the present invention, there is provided a storage medium storing a computer program for executing a film forming method on a computer, wherein the film forming method includes: generating bubbles having a diameter of 1000 nm or less and charged positively or negatively in a liquid material for film formation by supplying a carrier gas for bubble generation into the liquid material; producing a mist of the liquid material by atomizing the liquid material containing the bubbles; obtaining a gas material by heating and vaporizing the mist of the liquid material; and performing a film forming process on a target object in a processing chamber by supplying the gas material to the target object.

In accordance with the present invention, the positively or negatively charged nano bubbles having a diameter of 1000 nm or less are generated in the liquid material for the film forming process of the target object. The liquid material is atomized and the mist is heated and vaporized. Small bubbles are uniformly dispersed in advance in the liquid material. Thus, when the liquid material is atomized, fine and uniform mist can be obtained and heat exchange is easily performed. Consequently, vaporization efficiency (heat exchange rate) is improved and generation of the particles can be reduced.

DETAILED DESCRIPTION OF THE EMBODIMENTS

Figure 1:
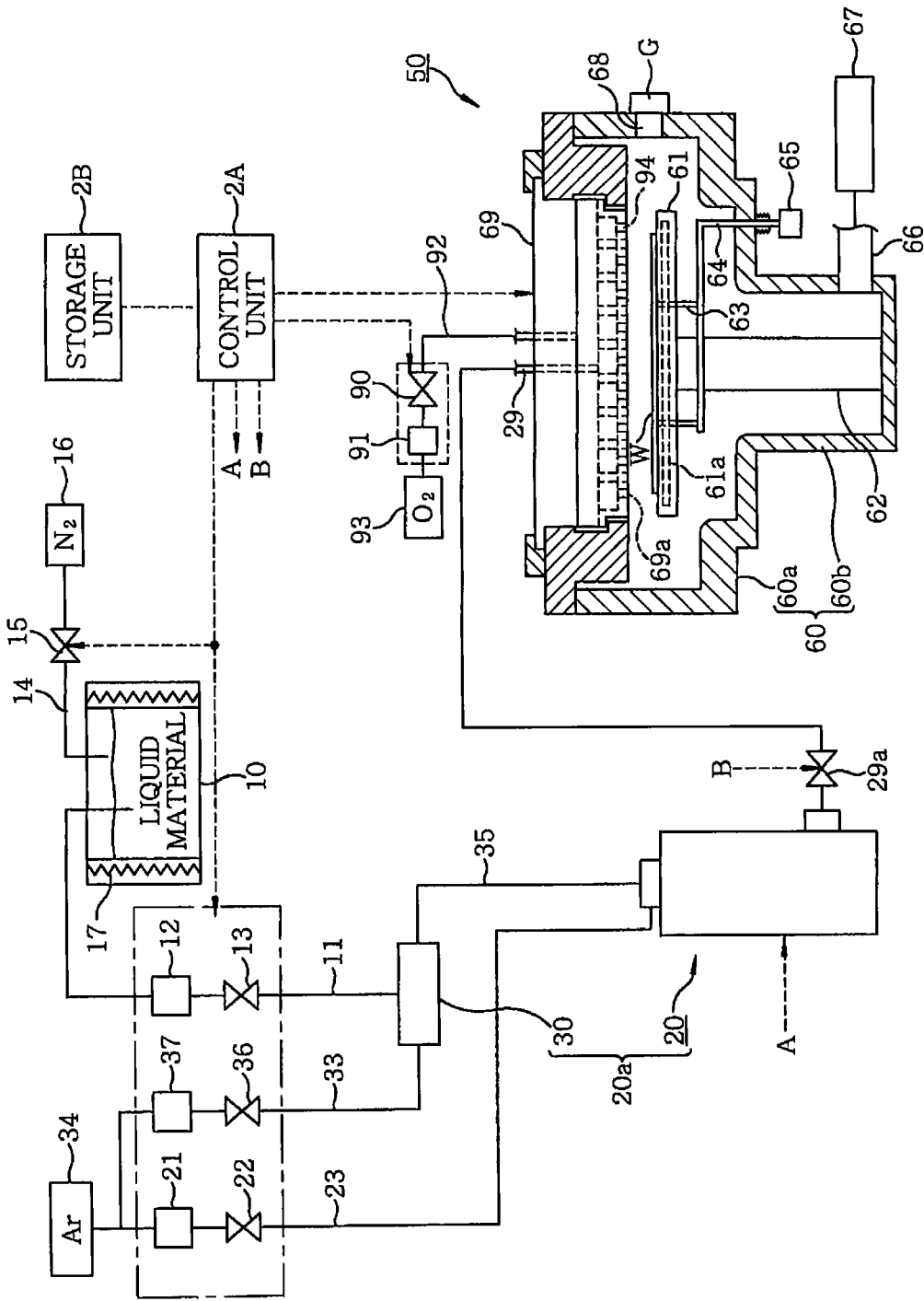
FIG. 1 illustrates a schematic configuration of a film forming apparatus for performing a film forming method in accordance with an embodiment of the present invention.
Figure 2A:
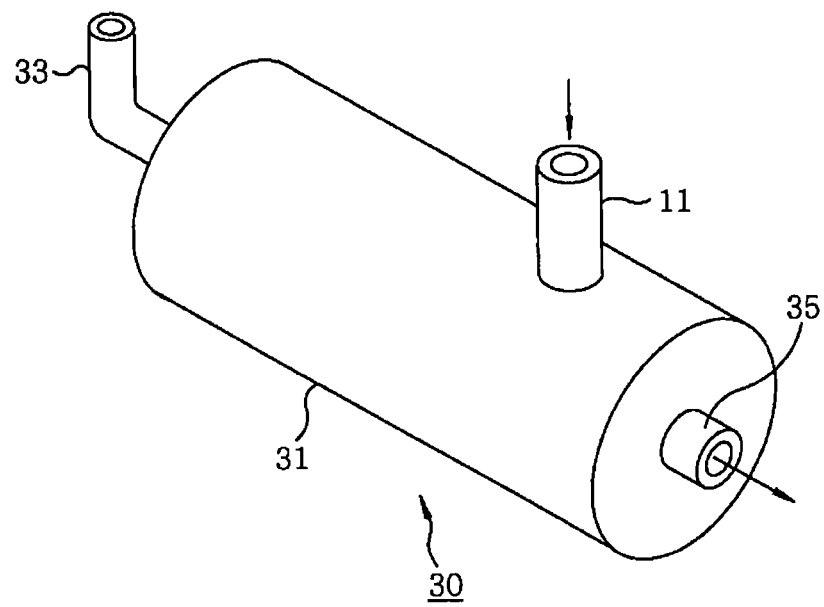
FIGS. 2A and 2B depict an example of a nano bubble generation device in the film forming apparatus.
Figure 2B:
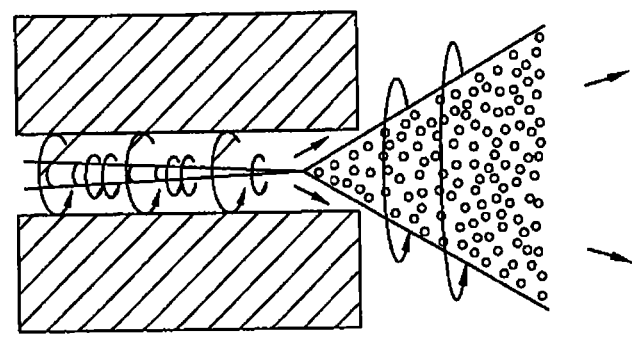
Figure 3:
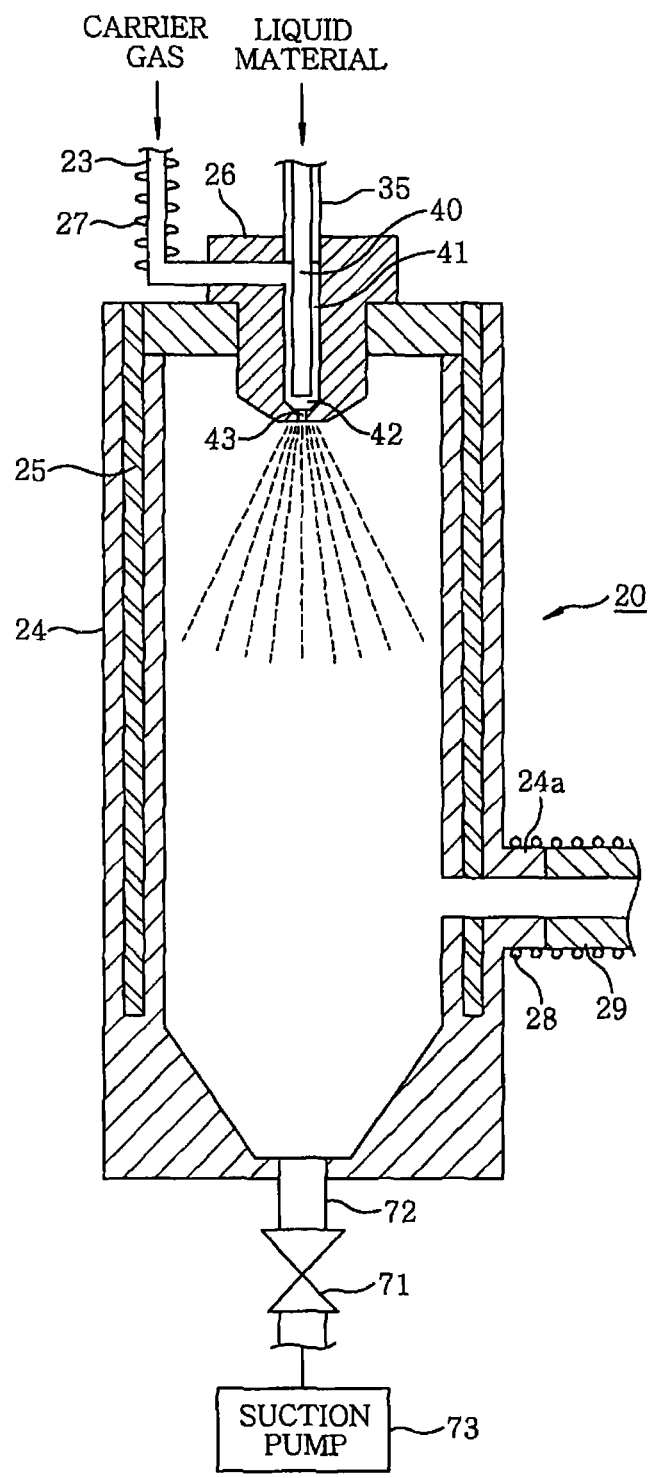
FIG. 3 is a longitudinal cross sectional view of a vaporizer of the film forming apparatus.

Hereinafter, an example of a film forming apparatus for performing a film forming method in accordance with an embodiment of the present invention will be described with reference to FIGS. 1 to 3. FIG. 1 illustrates a schematic configuration of a film forming apparatus for performing a film forming process on a target substrate such as a semiconductor wafer (hereinafter, referred to as a "wafer") W. The film forming apparatus includes a liquid material reservoir 10 storing a liquid material for film formation, e.g., a compound containing hafnium such as TEMAH, a vaporizing unit 20a for vaporizing the liquid material of the liquid material reservoir 10, and a film forming unit 50 for performing a film forming process by causing a gas material, which is obtained by vaporizing the liquid material in the vaporizing unit 20a, to react on the surface of the wafer W.

In the liquid material reservoir 10, one end of a gas supply line 14 is provided in an open state at a position higher than a liquid surface of the liquid material in the liquid material reservoir 10. The other end of the gas supply line 14 is connected to a nitrogen gas source 16 for supplying a nonreactive gas, e.g., nitrogen gas, via a valve 15. Further, one end of a liquid material supply line 11 is provided in an open state at a position lower than the liquid surface of the liquid material in the liquid material reservoir 10. The other end of the liquid material supply line 11 is connected to a nano bubble generation device (bubble generation device) 30 for generating very tiny bubbles, i.e., nano bubbles, via a mass flow controller 12 and a valve 13. Further, a heater 17 is provided in the liquid material reservoir 10 to heat the liquid material to a temperature of, e.g., 50° C.

Here, nano bubbles refer to bubbles having a diameter of, e.g., 10 nm or less. The diameter of the bubbles is not limited to several nm. However, when the bubbles are too large, dispersion in the liquid deteriorates due to buoyancy and, thus, a uniform gas-liquid mixed fluid cannot be obtained. Accordingly, the diameter of the bubbles is required to be smaller than 1000 nm. Further, these bubbles are required to be charged positively or negatively to prevent agglutination of the bubbles and, in this embodiment, they are charged negatively. The nano bubble generation device 30 for generating the nano bubbles is described with reference to FIGS. 2A and 2B.

The nano bubble generation device 30 is configured as, e.g., a micro-nano bubble generator made by Nanoplanet Research Institute Corporation. As shown in FIG. 2A, the nano bubble generation device 30 has a cylindrical housing 31. The liquid material supply line 11 is connected to an upper side of the side surface (circumferential surface) of the housing 31. Further, a gas supply line 33 for supplying a carrier gas for generation of nano bubbles is connected to one end surface of the housing 31. As shown in FIG. 1, a nonreactive gas supply source 34 storing therein a nonreactive gas such as Ar gas is connected to an upstream side of the gas supply line 33 via a valve 36 and a mass flow controller 37. A liquid material line 35 is connected to the other end surface of the housing 31, which is opposite to the surface connected to the gas supply line 33.

A process of generation of nano bubbles in the nano bubble generation device 30 will be described. First, when the liquid material is supplied into the housing 31, the liquid material flows toward the gas supply line 33 in the housing 31 and, then, flows toward the liquid material line 35 in the housing 31 while violently revolving along an inner peripheral surface of the housing 31. A negative pressure of, e.g., 0.06 MPa (450 Torr) is generated, as in an aspirator, by the flow of the liquid material. Accordingly, the gas for nano bubble generation supplied from the gas supply line 33 is sucked by the negative pressure and, thus, flows toward the liquid material line 35 at the center of the revolving flow of the liquid material. The revolving flow of the liquid material has a revolving radius gradually decreasing as it goes toward the liquid material line 35. Consequently, at the end side of the housing 31, as shown in FIG. 2B, the liquid material and the gas are violently mixed with each other to generate nano bubbles.

The nano bubbles have negative charges of, e.g., 40 to 100 mV by friction with the revolving flow of the liquid material (see "Shrinking Process and Shrinking Pattern of Micro Bubbles", Hirofumi OHNARI and Yui TSUNAMI, 1st Symposium on Micro-Nano Bubble Technology). Further, the nano bubbles may be generated by, e.g., electrolysis in addition to the aforementioned method.

As shown in FIG. 1, a vaporizer 20 is connected to the downstream side of the nano bubble generation device 30 via the liquid material line 35. Further, the nonreactive gas supply source 34 is connected to the vaporizer 20 via a carrier gas supply line 23 provided with a valve 21 and a mass flow controller 22. The nano bubble generation device 30, the vaporizer 20 connected to the nano bubble generation device 30, and a gas material outlet port 24a provided in the vaporizer 20 constitute the vaporizing unit 20a. The vaporizer 20 includes, as shown in FIG. 3, a cylindrical vaporization chamber 24 elongated in a vertical direction, a heater 25 embedded in a sidewall of the vaporization chamber 24, and an atomization nozzle (atomization part) 26 of, e.g., a double-fluid nozzle, which is provided at an upper side (inlet) of the vaporization chamber 24 and has a liquid contacting portion covered with a nonmetallic material.

The atomization nozzle 26 has a double-pipe structure including a liquid material flow path 40 for flowing the liquid material downward in an inner central portion of the atomization nozzle 26 and a carrier gas flow path 41 for flowing the carrier gas of a nonreactive gas therein, the carrier gas flow path 41 surrounding the liquid material flow path 40. The liquid material flow path 40 and the carrier gas flow path 41 are connected to the liquid material line 35 and the carrier gas supply line 23, respectively.

Further, a leading end portion 42 of the atomization nozzle 26 is configured such that an outer diameter of the carrier gas flow path 41 rapidly decreases. At the leading end portion 42, the liquid material is fragmented into small droplets by the pressure of the carrier gas to produce a mist of the liquid material. The mist is sprayed into the vaporization chamber 24 through a very small discharge hole 43 formed at the leading end of the atomization nozzle 26.

A first heater 27 is provided at the carrier gas supply line 23. The gas material outlet port 24a is provided at a lower side surface of the vaporization chamber 24. A gas material outlet line 29 is connected to the gas material outlet port 24a. The gas material outlet port 24a and the gas material outlet line 29 are provided with a second heater 28 to prevent re-liquefaction of the gas material.

A suction pump 73 is connected to a bottom surface of the vaporization chamber 24 via a liquid drain line 72 provided with a valve 71. For instance, the unvaporized mist adhered to the bottom surface of the vaporization chamber 24 is discharged through the liquid drain line 72. Further, the structure of the atomization nozzle 26 is simply illustrated. The film forming unit 50 is connected to the downstream side of the gas material outlet line 29 via a valve 29a. The film forming unit 50 includes a processing chamber 60 formed in a mushroom shape having an upper large-diameter cylindrical part 60a and a lower small-diameter cylindrical part 60b that are connected to each other. A stage 61 for horizontally mounting the wafer W thereon is provided in the processing chamber 60. The stage is supported by a supporting member 62 at a bottom portion of the small-diameter cylindrical part 60b.

A heater 61a and an electrostatic chuck (not shown) for attracting and holding the wafer W are provided in the stage 61. Further, e.g., three elevating pins 63 (only two pins are shown for simplicity) for elevating the wafer W to allow the wafer W to be delivered to/from a transfer unit (not shown) are provided in the stage 61 such that they can be protruded from and retracted into the surface of the stage 61. The elevating pins 63 are connected to a lift mechanism 65 provided outside the processing chamber 60 via a supporting part 64. A bottom portion of the processing chamber 60 is connected to one end of a gas exhaust pipe 66. A vacuum exhaust device 67 having a vacuum pump and a pressure controller is connected to the other end of the gas exhaust pipe 66. Further, a transfer port 68 that is opened and closed by a gate valve G is formed at a sidewall of the large-diameter cylindrical part 60a of the processing chamber 60.

A gas shower head 69 serving as a gas supply unit is provided at a central ceiling portion of the processing chamber 60 to face the stage 61. A number of gas supply holes 69a are opened at a bottom surface of the gas shower head 69 to supply a gas flowing in the gas shower head 69 to the wafer W. The gas material outlet line 29 is connected to a top surface of the gas shower head 69. Further, an oxidizing gas source 93 storing therein an oxidizing gas such as oxygen gas is connected to the top surface of the gas shower head 69 via an oxidizing gas supply line 92 provided with a valve 90 and a mass flow controller 91. A gas flow path of the oxygen gas supplied from the oxidizing gas source 93 and a gas flow path of the gas material are separately provided in the gas shower head 69 such that the oxygen gas and the gas material are not mixed with each other. The oxygen gas is supplied to the wafer W through oxidizing gas supply holes 94 formed at the bottom surface of the gas shower head 69.

The film forming apparatus includes, as shown in FIG. 1, a control unit 2A having, e.g., a computer. The control unit 2A includes a data processing part having a program, a memory and a CPU, and the like. The program includes commands (steps) such that the control unit 2A transmits control signals to components of the film forming apparatus to perform the steps. Further, the memory has a section allowing input of process parameters such as a process pressure, a process temperature, process time, a gas flow rate and a power level. When the CPU executes the commands of the program, the process parameters are read and the control signals corresponding to the parameters are transmitted to the corresponding components of the film forming apparatus. The program (including a program for input and display of the process parameters) is stored in a computer-readable storage medium, i.e., a storage unit 2B such as a flexible disk, a compact disk, a hard disk, a magneto-optical (MO) disk, and the like, and is installed in the control unit 2A.

Next, a film forming method in accordance with the embodiment of the present invention will be described. First, nitrogen gas is supplied from the nitrogen gas source 16 to the liquid material reservoir 10 containing the liquid material maintained at a temperature of, e.g., 50° C. by the heater 17. At this time, the liquid surface of the liquid material is pressed by the pressure of the nitrogen gas, so that the liquid material flows into the nano bubble generation device 30 through the liquid material supply line 11. Further, when a nonreactive gas is supplied from the nonreactive gas supply source 34 to the nano bubble generation device 30, nano bubbles are generated in the liquid material as described above.

The nano bubbles have negative charges as described above and repel each other. Accordingly, the nano bubbles are uniformly dispersed in the liquid material. Further, the liquid material having the nano bubbles dispersed therein flows down in the liquid material flow path 40 formed at the center of the atomization nozzle 26 of the vaporizer 20. The liquid material is fragmented, at the leading end portion 42 of the atomization nozzle 26, by the carrier gas flowing out of the carrier gas flow path 41 provided outside the liquid material flow path 40.

Figure 4:
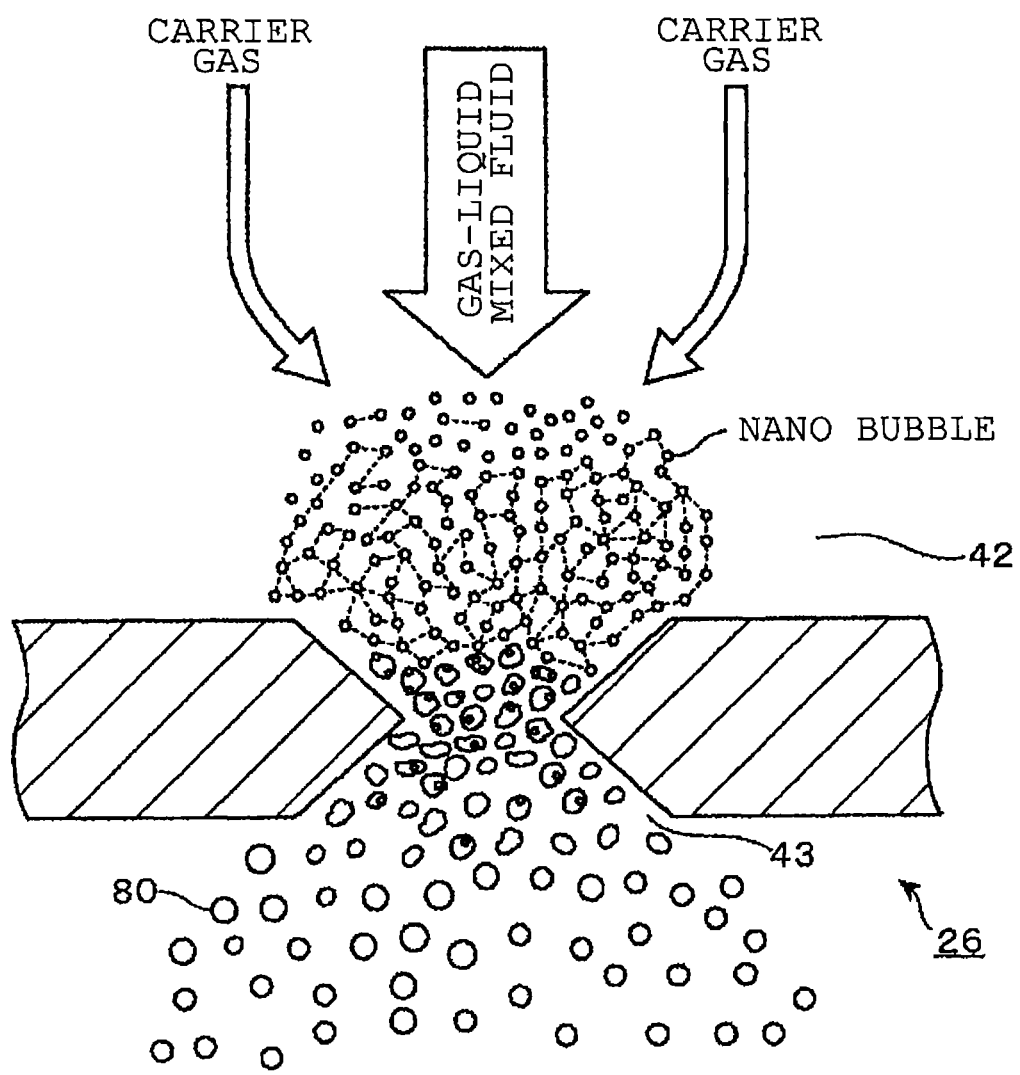
FIG. 4 schematically shows a process in which a liquid material is converted into a mist in the vaporizer.
Figure 5:
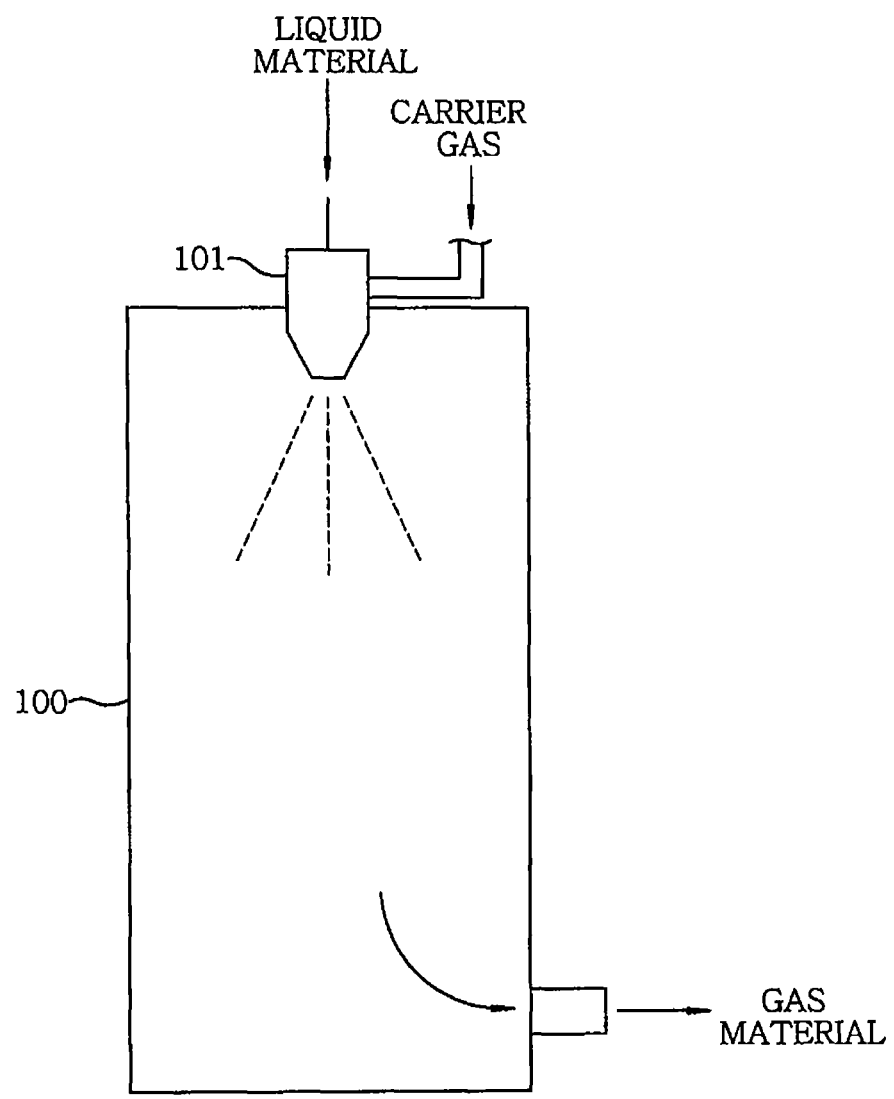
FIG. 5 is a side view schematically showing a conventional vaporizer.

As described above, the nano bubbles are uniformly dispersed in the liquid material to form a uniform gas-liquid mixed fluid. Accordingly, as shown in FIG. 4, when the liquid material is fragmented by the carrier gas, fragment lines are interrupted by the nano bubbles and new fragment lines are generated from the corresponding nano bubbles. Consequently, the liquid material is finely and uniformly divided to produce uniform and fine mist particles 80 of the liquid material at the discharge hole 43 of the atomization nozzle 26. Thus, the liquid material is atomized into fine droplets to be supplied into the vaporization chamber 24.

Further, the nano bubbles are exposed at the surfaces of the mist particles 80, and the nano bubbles seemingly disappear. Accordingly, the negative charges of the nano bubbles are transferred to the mist particles 80 or the air in the vaporization chamber 24. When the mist particles 80 are provided with negative charges, the mist particles 80 repel each other, thereby preventing agglutination after vaporization. When the air is provided with negative charges, the negative charges combine with positive ions in the air to be neutralized.

Meanwhile, the mist particles 80 are heated to a temperature of, e.g., 150° C. by the heat of the heater 25 provided at the sidewall of the vaporization chamber 24 and the heat of the carrier gas. The mist particles 80 have a uniform and small diameter, so that they can be surely vaporized by rapid heat exchange to produce a gas material. Further, when the negative charges of the nano bubbles are transferred to the mist particles 80 and the mist particles have the negative charges, the mist particles 80 are prevented from being agglutinated and formation of large droplets is suppressed, thereby achieving further rapid heat exchange.

The flow of the gas material is bent at a lower portion of the vaporization chamber so that the gas material is introduced into the gas material outlet line 29, while unvaporized particles of the mist particles 80 are accumulated at the lower portion of the vaporization chamber 24 by gravity. Thus, gas-liquid separation is achieved in the vaporization chamber 24. In this case, the heat exchange rate of the mist particles 80 is high so that the gas material introduced into the gas material outlet line 29 rarely includes the mist particles 80. The mist particles accumulated on the bottom surface of the vaporization chamber 24 are discharged through the liquid drain line 72 by the suction pump 73 by regularly opening the valve 71.

Further, the gas material is supplied into the processing chamber 60 of the film forming unit 50 through the gas shower head 69 while the re-liquefaction of the gas material is prevented by the heat of the second heater 28. In the film forming unit 50, the wafer W is heated in advance and maintained at a predetermined temperature, and the inside of the processing chamber 60 is depressurized. In this state, the gas material reacts with the oxygen gas supplied through the gas shower head 69 on the surface of the wafer W to produce film forming species. The film forming species are deposited on the wafer W, thereby forming, e.g., a hafnium oxide film.

In accordance with the embodiment of the present invention, the negatively-charged nano bubbles having a diameter of 1000 nm or less are generated in the liquid material for the film forming process of the wafer W. The liquid material is atomized to produce the mist particles 80 and the mist particles 80 are heated and vaporized. That is, small bubbles are uniformly dispersed in advance in the liquid material. Thus, when the liquid material is atomized, fine and uniform mist particles 80 can be obtained and heat exchange is easily performed. Consequently, vaporization efficiency is improved and generation of the particles can be reduced.

Further, when the mist particles 80 obtained by atomization are provided with negative charges, the mist particles 80 repel each other, thereby preventing agglutination of the mist particles 80. Accordingly, vaporization efficiency is further improved and generation of the particles can be suppressed.

Although the film forming process is performed by heating in the above embodiment, the film forming process may be performed by using a plasma of the gas material. Further, the film forming method in accordance with the embodiment of the present invention may be applied to a case in which a film forming process is performed in a batch furnace, e.g., a vertical heat treatment furnace. In this case, a flow rate of the liquid material is required to be larger than that in a single-wafer film forming apparatus, but the present invention can be effectively applied thereto due to improved vaporization efficiency.

Although the Ar gas is used as a gas for generation of nano bubbles in the above embodiment, another nonreactive gas such as nitrogen gas or an active gas such as $O_2$ gas may be used instead of Ar gas.

What is claimed is:

1. A film forming method comprising:

generating gas bubbles having a diameter of 1000 nm or less and charged positively or negatively in a liquid material by blowing a first carrier gas into the liquid material in a first unit;

transporting the liquid material laden with the gas bubbles from the first unit to a second unit through a liquid material line;

producing a mist from the liquid material laden with the gas bubbles by atomizing the liquid material laden with the gas bubbles by a second carrier gas through the use of the second unit;

obtaining a gas material by heating and vaporizing the mist; and performing a film forming process on a target object in a processing chamber by supplying the gas material to the target object, wherein the first unit and the second unit are spatially separated from each other.

2. The film forming method of claim 1, wherein said generating the gas bubbles includes producing a revolving flow of the liquid material.

3. The film forming method of claim 1, wherein the second unit is an atomization nozzle.

4. The film forming method of claim 3, wherein the second carrier gas is supplied through a carrier gas flow path surrounding a flow path through which the liquid material laden with the gas bubbles flows, the carrier gas flow path having, at a leading end portion of the atomization nozzle, a rapidly decreasing outer diameter.

5. The film forming method of claim 1, wherein said producing the mist includes transferring charges of the gas bubbles to the mist while the liquid material laden with the gas bubbles is atomized.

6. The film forming method of claim 1, wherein the first unit is a nano bubble generation device and the second unit is an atomization nozzle.

\* \* \* \* \*